(12) United States Patent  
Mounier et al.

(10) Patent No.: US 10,606,329 B2  
(45) Date of Patent: Mar. 31, 2020

(54) SAFETY CIRCUIT FOR AN ELECTRICAL SYSTEM

(71) Applicant: NXP USA, Inc., Austin, TX (US)

(72) Inventors: Philippe Mounier, Tournefeuille (FR); Eric Pierre Rolland, Grepiac (FR); Guillaume Founaud, Saint-Orens de Gameville (FR); Maxime Clairet, Labastidette (FR)

(73) Assignee: NXP USA, Inc., Austin, TX (US)

(*) Notice: Subject to any disclaimer, the term of this patent is extended or adjusted under 35 U.S.C. 154(b) by 543 days.

(21) Appl. No.: 15/462,402

(22) Filed: Mar. 17, 2017

(65) Prior Publication Data

US 2017/0344089 A1 Nov. 30, 2017

(30) Foreign Application Priority Data

May 30, 2016 (EP) .................................... 16290095

(51) Int. Cl.
| | |
|---|---|
| *G06F 1/30* | (2006.01) |
| *H02H 1/00* | (2006.01) |
| *G01R 31/28* | (2006.01) |
| *H02H 7/08* | (2006.01) |
| *G05B 9/02* | (2006.01) |

(52) U.S. Cl.  
CPC ............ *G06F 1/30* (2013.01); *G01R 31/2851* (2013.01); *G05B 9/02* (2013.01); *H02H 1/0007* (2013.01); *H02H 7/0838* (2013.01)

(58) Field of Classification Search  
CPC ...... B60R 16/02; G01R 31/2851; G05B 9/02; G06F 1/30; H02H 1/0007; H02H 3/006; H02H 7/0838  
See application file for complete search history.

(56) References Cited

U.S. PATENT DOCUMENTS

| | | | | |
|---|---|---|---|---|
| 4,246,493 | A | | 1/1981 | Beeghly |
| 5,144,230 | A | * | 9/1992 | Katoozi ................. G06F 11/184 324/537 |
| 5,218,339 | A | * | 6/1993 | Schrumpf .............. F02D 41/221 340/439 |
| 2008/0309163 | A1 | * | 12/2008 | Hashimoto ........... H02J 7/0029 307/31 |
| 2009/0024885 | A1 | | 1/2009 | Anzou et al. |
| 2009/0302860 | A1 | | 12/2009 | Cahoon |

FOREIGN PATENT DOCUMENTS

CN 105164881 A 12/2015

\* cited by examiner

*Primary Examiner* — Thienvu V Tran  
*Assistant Examiner* — Nicolas Bellido (57) ABSTRACT

An integrated circuit comprising: an input terminal configured to receive a failure-event-signal representative of a failure event; a first output terminal configured to provide a first-failure-signal; and a second output terminal configured to provide a second-failure-signal; and a processing block configured to: set the first-failure-signal based on the failure-event-signal; and set the second-failure-signal, at a predetermined time interval after the first-failure-signal is set. The processing block further comprises a switch configured selectively, based on a received digital-error-signal to either: set the second-failure-signal based on a digital-counter-output-signal; or set the second-failure-signal based on an analogue-trigger-signal.

15 Claims, 3 Drawing Sheets

SAFETY CIRCUIT FOR AN ELECTRICAL SYSTEM

BACKGROUND

The present disclosure relates to electrical circuits, and in particular, although not necessarily, to integrated circuits configured to provide safety signalling in response to a failure event.

In any electrical system it is possible that some part of the system may fail, in what may be called a 'failure event'. In some cases a failure event may cause damaging consequences if it is not appropriately managed, whereas if appropriate safety systems are in place some or all damaging consequences may be avoided or at least reduced in significance.

SUMMARY

According to a first aspect of the present disclosure there is provided an integrated circuit comprising:
an input terminal configured to receive a failure-event-signal representative of a failure event;
a first output terminal configured to provide a first-failure-signal; and
a second output terminal configured to provide a second-failure-signal; and
a processing block configured to:
set the first-failure-signal based on the failure-event-signal; and
set the second-failure-signal, at a predetermined time interval after the first-failure-signal is set,
wherein the processing block further comprises a switch configured selectively, based on a received digital-error-signal to either:
set the second-failure-signal based on a digital-counter-output-signal; or
set the second-failure-signal based on an analogue-trigger-signal.

In one or more embodiments the processing block comprises a digital-counter configured to receive the first-failure-signal and generate a digital-counter-output-signal that is configured to set the second-failure-signal at the predetermined time interval after the first-failure-signal is set.

In one or more embodiments the integrated circuit further comprises an analogue-timing-input-terminal configured to receive an analogue-timing-signal. The processing block may comprise a comparator configured to set the second-failure-signal at the predetermined time interval after the first-failure-signal is set based on the analogue-timing-signal.

In one or more embodiments the comparator is configured to set an analogue-trigger-signal in response to the analogue-timing-signal satisfying a threshold value.

In one or more embodiments the processing block further comprises an analogue-timing-control-block configured to: receive an analogue-error-signal; and initiate a change in the analogue-timing-signal based on the analogue-error-signal.

In one or more embodiments the processing block further comprises an analogue-self-test-block configured to:
provide an error-signal to the analogue-timing-control-block based on a received analogue-self-test-signal, wherein the error-signal is configured to initiate a change in the analogue-timing-signal; and
process the analogue-timing-signal in order to generate an analogue-self-test-output-signal based on whether or not the analogue-timing-signal satisfies a predetermined criterion.

In one or more embodiments the error-signal is indicative of an error associated with the digital-counter and/or an error associated with a power supply for the integrated circuit.

In one or more embodiments the processing block further comprises an error-detection-block configured to provide the error-signal based on a status of (i) the digital-counter and/or (ii) a power supply for the integrated circuit.

In one or more embodiments the processing block comprises a driver configured to set the second-failure-signal based on either a digital-counter-output-signal or an analogue-timing-signal. The driver may comprise a driver-power-terminal configured to receive power from a plurality of power supplies. In one or more embodiments the plurality of power supplies comprise one or more power supplies that are internal to the integrated circuit. The plurality of power supplies may comprise one or more power-supply-terminals configured to receive power from one or more power supplies that are external to the integrated circuit.

In one or more embodiments a power-supply-terminal comprises the analogue-timing-input-terminal.

There may be provided a system comprising:
any integrated circuit disclosed herein, comprising an analogue-timing-input-terminal configured to receive an analogue-timing-signal; and
an analogue-timing-circuit configured to provide the analogue-timing-signal.

In one or more embodiments the system comprises an electrical load that is connected to a first set of switches and a second set of switches. The first set of switches may be configured to be operated based on the first-failure-signal. The second set of switches may be configured to be operated based on the second-failure-signal.

The processing block may further comprise a digital-self-test-block configured to test the functionality of the digital-counter.

There may be provided an automotive system comprising any integrated circuit disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying Drawings in which.

DETAILED DESCRIPTION OF THE DRAWINGS

To initiate the safe management of a failure event, an electrical system may comprise a sub-system configured to respond to a failure event by providing an output, which may be called a failure-signal. The failure-signal may then be provided to other components of the electrical system to manage the failure event.

In some examples, at least part of the sub-system described above may be provided as an integrated circuit.

Figure 1:
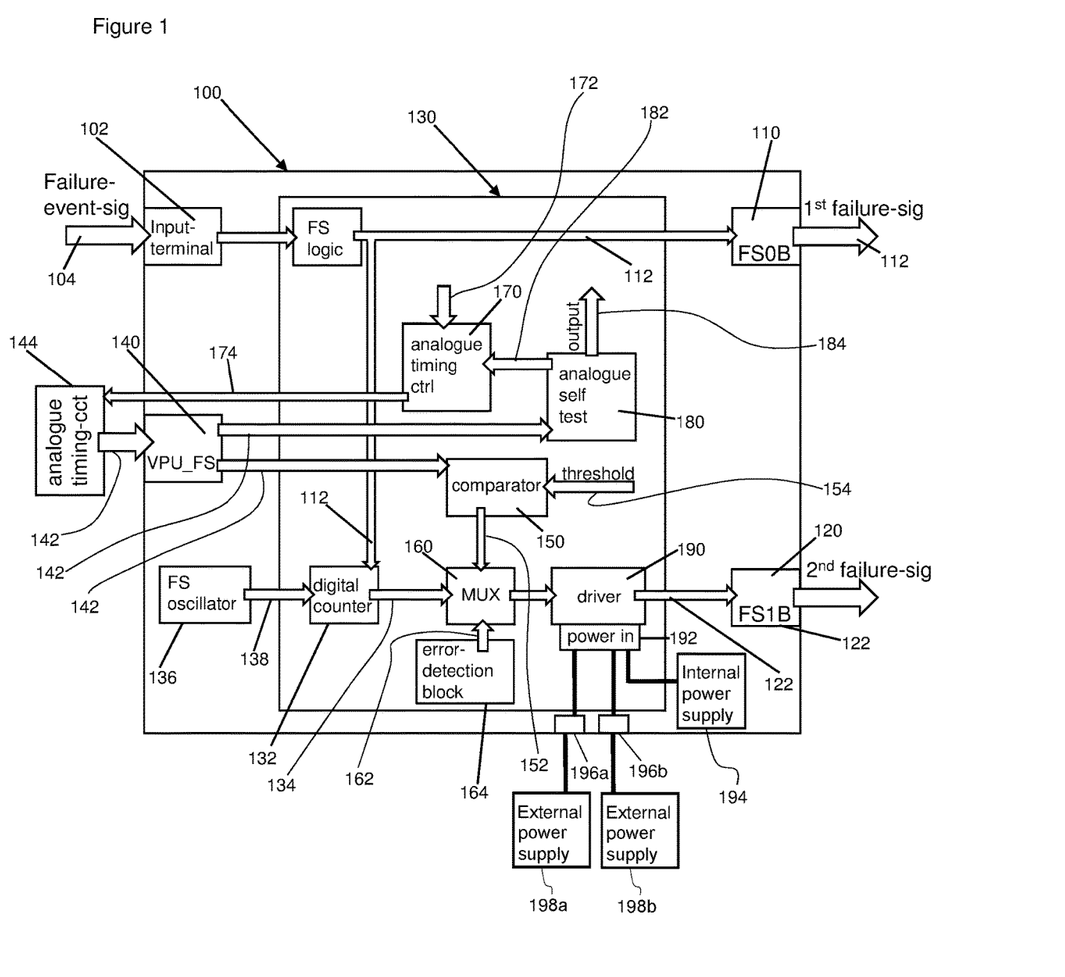
FIG. 1 shows an example embodiment of an integrated circuit configured to provide two separate failure signals following a failure event.

FIG. 1 shows a high level view of an example embodiment of an integrated circuit 100.

The integrated circuit 100 of FIG. 1 comprises an input terminal 102 configured to receive a failure-event-signal 104 representative of a failure event. In some examples the integrated circuit 100 may be a sub-component of a larger integrated circuit (not shown), and therefore the input terminal 102 may be an internal connection within the larger integrated circuit. The integrated circuit 100 further comprises a first output terminal 110 (which may also be referred to as 'FS0B') configured to provide a first-failure-signal 112.

In this way, the first-failure-signal 112 may be sent to a remote component (not shown) that may consequently be configured to perform an action designed to manage the failure event. For example, the first-failure-signal 112 may initiate the opening of a switch in order to electrically isolate a failed component or a component coupled to a failed component.

The integrated circuit further comprises a second output terminal 120 (which may also be referred to as 'FS1B') configured to provide a second-failure-signal 122. Similarly to the first-failure-signal 112, the second-failure-signal 122 may be provided to a remote component in order to manage the failure event.

The integrated circuit 100 also comprises a processing block 130 configured to set the first-failure-signal 112 based on the failure-event-signal 104 and set the second-failure-signal 122 at a predetermined time interval after the first-failure-signal 112 is set. In this way, the integrated circuit 100 is configured to provide two failure signals in succession, where the two signals are separated by a precisely controlled predetermined time interval. It may be advantageous to provide both failure signals from the same integrated circuit 100 as this may provide a compact and resilient means of providing the failure signals.

Where an electrical system comprises a plurality of failure management components it may be advantageous to provide the second-failure-signal 122 at a specific time after providing the first-failure-signal 112, such that a sequence of failure management actions may be initiated according to a particular predetermined time sequence. When the predetermined time sequence is important to the effective management of the failure event, it will be correspondingly important to ensure that the predetermined time interval is controlled to a high degree of accuracy. It may not be straightforward to guarantee the duration of the predetermined time interval during a failure event because some failure events may adversely affect the integrated circuit 100. It is therefore desirable to find mechanisms to decrease the likelihood that any particular failure event may alter the predetermined time interval, or even prevent the integrated circuit 100 from providing the second-failure-signal 122 at all. A variety of optional features are described below that can provide this functionality.

The processing block 130 may comprise a digital-counter 132 configured to receive the first-failure-signal 112 and generate a digital-counter-output-signal 134 that is configured to set the second-failure-signal 122 at the predetermined time interval after the first-failure-signal 112 is set. Alternatively, the digital-counter 132 may be configured to receive a signal that is representative of the first-failure-signal 112, or may be configured to receive the failure event signal 104, or a signal representative of the failure event signal 104. In any case, the signal received by the digital-counter 132 initiates the digital-counter 132 to determine when the predetermined time interval will have elapsed such that the integrated circuit may provide the second-failure-signal 122, at the second output terminal 120, at the end of the predetermined time interval, as desired.

In this example, an oscillator 136 is coupled to the digital-counter 132. The oscillator 136 is provided as part of the integrated circuit 100 and is configured to supply an oscillator signal 138 to the digital-counter 132. The digital-counter 132 may determine when the predetermined time interval has elapsed by counting the number of oscillations received from the oscillator 136 once the first-failure-signal 112 has been received, and comparing the count with a digital-threshold-value that is representative of the predetermined time interval. Any other suitable digital circuitry may be used to provide the functionality of the digital-counter 132.

The integrated circuit further comprises an analogue-timing-input-terminal 140 (which may also be referred to as 'VPU_FS') that is configured to receive an analogue-timing-signal 142 from an external analogue timing circuit 144 (that is external to the integrated circuit 100). It will be appreciated that the functionality of the analogue timing circuit 144 could alternatively be provided by a block (not shown) provided within the integrated circuit 100. Details relating to the analogue timing circuit and the analogue-timing-signal will be discussed below in relation to FIGS. 2 and 3.

The processing block 130 comprises a comparator 150 that is configured to set the second-failure-signal 122 at the predetermined time interval after the first-failure-signal 112 is set, based on the analogue-timing-signal 142. In this example the analogue-timing-signal 142 is provided to the comparator 150, although it will be appreciated that the same functionality could be achieved by providing a signal representative of the analogue-timing-signal 142 to the comparator 150 instead.

The comparator 150 is configured to set an analogue-trigger-signal 152 in response to the analogue-timing-signal 142 satisfying a threshold value (which may also be referred to as 'FS1B-trig'). The threshold value may be set by a threshold signal 154 which may be generated remotely from the integrated circuit 100. In this way, the comparator 150 may be reconfigurable to set the analogue-trigger-signal 152 in response to any threshold value that may be desired, and thereby control the length of the predetermined time interval.

The analogue-timing-signal 142 may be a signal that starts at a particular signal level and then decays to a lower level over a period of time. Where the rate of change of the analogue-timing-signal 142 is known, the threshold value may be chosen such that the analogue-timing-signal 142 reaches the threshold value after a time interval equal to the predetermined time interval that separates the provision of the first-failure-signal 112 and the second-failure-signal 122. It will be appreciated that the same functionality may be achieved when the analogue-timing-signal 142 starts at a low value and increases over time to the threshold value.

The time delay between the first-error-signal and the second-error-signal is configurable in this non-limiting example from 0 ms to 3150 ms, and may be defined by both the digital-threshold-value and the threshold value that is used by the comparator 150. More generally, the predetermined time interval between the first-error-signal and the second-error-signal may be set from a few milliseconds (such as 2 ms or 10 ms) to a few seconds (such as 2 or 3 seconds).

The processing block 130 further comprises a switch 160, which may be a multiplexer or 'MUX'. The switch 160 is configured selectively, based on a received digital-error-signal 162, to either: (i) set the second-failure-signal 122 based on the digital-counter-output-signal 134; or (ii) set the second-failure-signal 122 based on the analogue-trigger-signal 152. The digital-error-signal 162 is generated by an error detection block 164 in this example, which is configured to detect any errors or failure events that may interfere with the accurate functioning of the digital-counter 132. If no error or failure event is detected by the error detection block 164 then the switch 160 may be configured to provide the digital-counter-output-signal 134 for the purpose of setting the second-failure-signal 122. Whereas if any error or failure event is detected, then the switch 160 may be reconfigured to provide the analogue-trigger-signal 152 for the purpose of setting the second-failure-signal 122 instead. In this way, the analogue-trigger-signal 142 acts as a back-up for the digital-counter-output-signal 134 to increase the likelihood that the second-failure-signal 122 will be set with the desired predetermined time interval after the first-failure-signal 112 has been set.

In this way, the integrated circuit monitors the digital-counter 132 and other associated components and may mitigate a failure of the monitored components by using the analogue-timing-signal 142 to set the second-failure-signal 122 at the required predetermined time interval after the first-failure-signal 112. This advantageously provides the second-failure-signal 122, at the required time, with an improved reliability even under failure conditions that may interfere with the functionality of the digital-counter 132.

The error-detection-block 164 may detect a variety of different types of error. As a non-limiting example, the error-detection-block 164 may detect a power failure in an electrical power supply (not shown) that provides power to the digital-counter 132 or the oscillator 136 or to some other component of the integrated circuit 100. It will be appreciated that other failure events may affect the functioning of the oscillator 136 or the digital-counter 132, and such failure events may also be detected by the error-detection-block 164. For example, the digital-counter 132, or a power supply for the integrated circuit 100, may provide a status-signal to the error-detection-block 164, to indicate an internal error. Receiving such a status-signal may constitute the detection of an error.

The processing block 130 further comprises an analogue-timing-control-block 170 configured to receive an analogue-error-signal 172. It will be appreciated that the analogue-error-signal 172 may be provided by the error-detection-block 164, or by another error processing block (not shown), which may be provided within the integrated circuit 100 or may be remote from the integrated circuit 100. In some examples the analogue-error-signal 172 may be the same as the digital-error-signal 162, or may be representative of the digital-error-signal 162. In other examples the analogue-error-signal 172 may be independent of the digital-error-signal 162. The analogue-error-signal 172 is representative of an error or failure event that may prejudice the provision of, or the accuracy of, the digital-counter-output-signal 134. When the analogue-timing-control-block 170 receives the analogue-error-signal 172 it is configured to initiate a change (such as an increase, a reduction or a discharge) in the analogue-timing-signal 142 based on the analogue-error-signal 172. The change may be initiated by an analogue-timing-circuit-control-signal 174 sent from the analogue-timing-control-block 170 to the analogue timing circuit 144. Once the change in the analogue-timing-signal 142 has been initiated the analogue-timing-signal 142 exhibits a known time dependent behaviour. In this way, the analogue-timing-signal 142 will reach the above mentioned threshold value after a predetermined time interval such that it may provide for the second-failure-signal 112 to be set at the desired time.

It will be appreciated that the digital-error-signal 162 may be provided in either digital or analogue form, while still providing the same functionality. Similarly, it will be appreciated that the analogue-error-signal 172 may be provided in either digital or analogue form, while still providing the same functionality.

The processing block 130 further comprises an analogue-self-test-block 180 configured to provide an analogue-test-control-signal 182 to the analogue-timing-control-block 170 based on a received analogue-self-test-signal (not shown). The analogue-self-test-signal may be provided automatically, for example at a time that the integrated circuit 100 and any associated equipment is switched on, or it may be provided in response to a user input. The analogue-test-control-signal 182 may cause the analogue-timing-control-block 170 to perform the same functionality as it does in response to the analogue-error-signal 172, but without the presence of any underlying error or failure event. In this way, the functionality of the analogue-timing-control-block 170 and the analogue timing circuit 144 may be tested to ensure that their operation occurs within acceptable tolerances. To achieve this, the analogue timing circuit 144 is configured to provide the analogue-timing-signal 142, or a signal representative of the analogue-timing-signal 142, to the analogue-self-test-block 180.

The analogue-self-test-block 180 is configured to process the analogue-timing-signal 142 in order to generate an analogue-self-test-output-signal 184 based on whether or not the analogue-timing-signal 142 satisfies a predetermined criterion. Satisfaction of the predetermined criterion may be achieved if the analogue-timing-signal 142 reaches the threshold value after a first expected period of time but before a second, longer, period of time has elapsed. The analogue-self-test-output-signal 184 may be provided to a component (not shown) that is external to the integrated circuit 100 in order to verify that the integrated circuit 100 is functioning correctly.

The processing block 130 in this example comprises a driver 190 configured to set the second-failure-signal 122 based on either the digital-counter-output-signal 134 or the analogue-trigger-signal 152. The switch 160 may be selectively configured (as described above) to provide either the digital-counter-output-signal 134 or the analogue-trigger-signal 152 to the driver 190, based on whether or not an error associated with the digital counter functionality has been detected.

The driver 190 comprises a driver-power-terminal 192 configured to receive power from a plurality of power supplies. The plurality of power supplies comprises an internal power supply 194 that is internal to the integrated circuit 100. The integrated circuit also comprises a plurality of power-supply-terminals 196a, 196b that are configured to receive power from one or more power supplies 198a, 198b (not shown) that are external to the integrated circuit 100. In this way, the likelihood that the integrated circuit 100 will function correctly, even in the event of a failure of one or more power supplies, is improved.

In some examples (not shown) one or more of the power-supply-terminals 196a, 196b may comprise an analogue-timing-input-terminal coupled to the analogue timing circuit 144. Such an example will be described below with reference to FIG. 2. In this way, the analogue timing circuit 144 may advantageously provide both the information comprising the analogue-timing-signal 142 and a source of electrical power. In some instances, the analogue-timing-signal 142 may itself provide electrical power to the integrated circuit 100.

In some examples (which are not illustrated) the processing block 130 may further comprise a digital-self-test-block configured to test the functionality of the digital-counter 132. If any deviation away from the behaviour expected of the digital-counter 132 is detected by the digital-self-test-block then it may output an error signal which may be provided to a component that is external to the integrated circuit 100. The test performed by the digital-self-test-block may be referred to as a Logic Built in Self Test (LBIST).

In some examples, a digital self test may verify that the digital part of the circuit driving the first output terminal 110 and the second output terminal 120 is functioning correctly in order to make sure the digital-counter 132 works correctly and that the output terminals will be provided with their respective error signals when a failure event is detected. An LBIST fail will prevent the release of the output terminals to maintain the system in Safe state. Generally, the safety output terminals can be asserted low by default when a device comprising a safety circuit of the present disclosure starts up.

Figure 2:
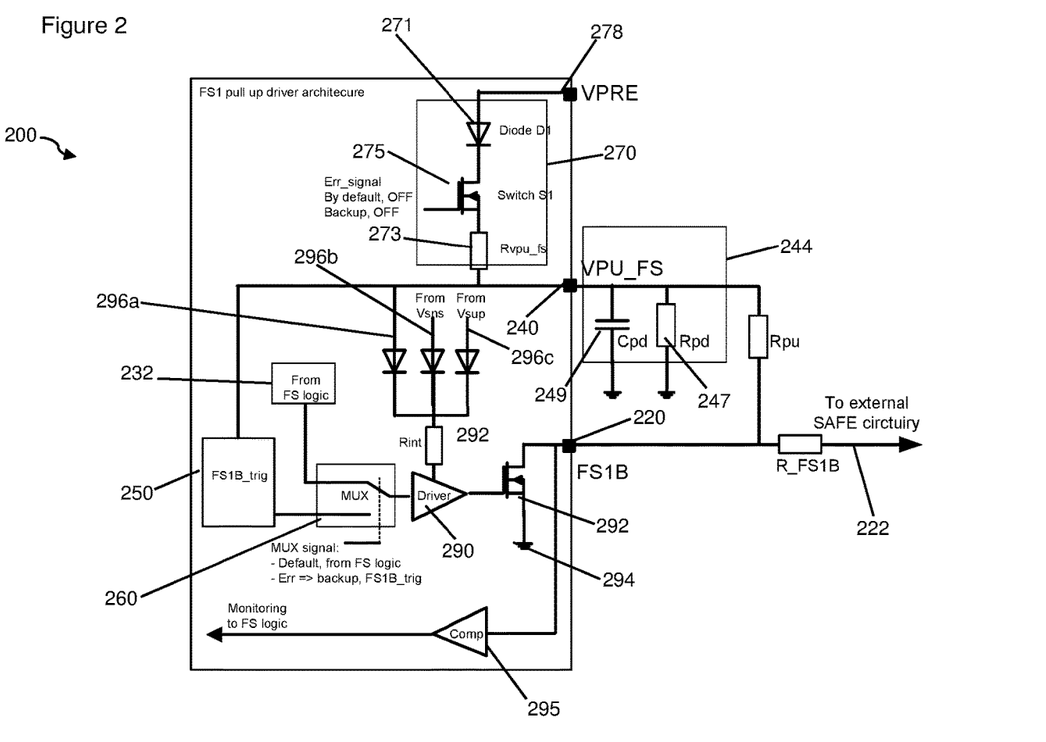
FIG. 2 shows an example embodiment of part of an integrated circuit similar to that of FIG. 1 coupled to an external RC network.

FIG. 2 shows a circuit 200 that implements some of the functionality described above in relation to FIG. 1. Features of the circuit 200 that are similar to features of FIG. 1 have been given similar reference numerals and may not necessarily be described further here.

The activation of the second-error-signal 222 (FS1B) at the second output terminal 220 follows the activation of the first-error-signal (FS0B) at a first output terminal (not shown) with a configurable delay. The configurable delay provides the functionality to ensure that the second-error-signal 222 is provided with the desired predetermined time interval following the provision of the first-error-signal.

The external analogue timing circuit 244 comprises a timing resistor 247 (Rpd) and a timing capacitor 249 (Cpd). These components 247, 249, which provide an RC network with a known time constant, are connected to the analogue-timing-input-terminal 240 and are configured to generate the second-error-signal 222 by providing an analog backup delay, to back up the digital-counter 232 in the case that an error is detected. It can be advantageous to select a high resistance value for the timing resistor 247 associated with the digital-counter 232 such that current flowing through the timing resistor 247 will be negligible compared to the current supplied to the analogue-timing-input-terminal 240. It can also be advantageous to select a low capacitance for the timing capacitor 249 to reduce the rising time required for the voltage across the timing capacitor 249 to reach a full value.

Calculation of appropriate values for the resistance and capacitance of the timing resistor 247 and the timing capacitor 249 may be performed in accordance with the below equations to set the time constant of the external analogue timing circuit 244. Also included below are some non-limiting example values that may be selected for these components.

$R_{PD}/C_{PD}$ Calculation:

$$R_{TOT}=R_{INT}//R_{PD} \text{ with } R_{INT}=1M+/-50\%$$

$$VPU\_FS=[(V_{PRE}-V_{DIODE}) \times R_{TOT}/(R_{TOT}+R_{VPU\_FS})]$$

$$Vpu\_FS\_th=VPU\_FS \times e(-t_{DELAY}/R_{TOT}C_{PD})$$

$$t_{DELAY}=-R_{TOT}C_{PD} \times Ln(Vpu\_FS\_th/VPU\_FS)$$

$R_{PD}/C_{PD}$ Typical Use Case:
$t_{DELAY}$=33 ms, Vpu_FS_th=3.2 V, VPU_FS=5.5 V
$R_{PD}$=16 KΩ, $C_{PD}$=3.3 μF The circuit 200 comprises an analogue-timing-input-terminal 240 (VPU_FS) that is internally connected to a reference terminal 278 (VPRE) with a reverse-biased diode 271 to provide protection, and is also protected against short circuits by a resistor 273 (RVPU_FS). The circuit 200 comprises a switch 275 (S1), situated between the reverse-biased diode 271 and the resistor 273, that is open by default and is configured to be closed by a command signal before the second-error-signal is provided.

In some examples the analogue-timing-input-terminal 240 (VPU_FS) may be provided as a FS1B pull up pin.

The role of these components (the reverse-biased diode 271, the switch 275 and the resistor 273) is to bring the necessary supply voltage to charge the timing capacitor 249 connected to the analogue-timing-input-terminal 240 or VPU_FS pin. By default, the switch 275 is open. The switch 275 is closed to charge the timing capacitor 249.

The analogue backup delay may be verified at application level to detect latent faults in the timing resistor 247 and/or the timing capacitor 249 by opening the switch 275 before a Low Power mode is initiated in order to verify the correct provision of the second-error-signal 222 with the expected analogue backup delay provided by the analogue timing circuit 244.

An integrated analogue BIST may be provided to test the first-error-signal (FS0B) and the second-error-signal (FS1B) pin state at power up. The respective signal values at the pins should be low if the system is operating without errors or failure events. An LBIST fail would prevent the release of the FS0B and FS1B pins to maintain the system in a Safe state. The integrated analogue BIST is configured to verify the external timing resistor 247 and timing capacitor 249 connections by opening and closing the switch 275.

The analogue back up delay may be engaged in the case that an error is detected. Such errors may comprise the loss of an electrical power supply or the detection of a loss of an internal fail-safe oscillator. If no error is detected then the second-error-signal 222 may be asserted after the first-error-signal has been asserted with the predetermined time interval delay provided by the digital-counter 232.

The second-error-signal may be monitored and diagnostic information about it may be provided to components outside of the circuit 200.

The digital-counter 232 may be verified to detect Latent Faults by a Logical Built in Self Test (BIST). Additionally, or alternatively, a component 295 may be used to provide an Analog BIST after each start up or wake up from a Low power mode. The component 295 may be used to compare the expected performance of the circuit 200 against the actual performance of the circuit 200 and provide an error signal if a discrepancy that is greater than a predetermined size is detected.

The component 295 is configured to monitor the second output terminal 220 or FS1B state. If the second output terminal 220 state is not as expected (for example: the component 295 receives a high level signal while the driver 290 is driving a low level signal), the component 295 will detect this mismatch and will react. The default state of the second output terminal 220 is checked at power up during ABIST. ABIST functions to verify latent faults in the component 295 and to make sure that it works correctly.

The activation of the second-error-signal 222 is configurable to occur at from a few milliseconds to a few seconds (such as from 0 ms to 3150 ms) after the activation of the first-error-signal. The predetermined time interval may be configure to have any one of a plurality of different discrete values that may be selected during an initialization phase. The default duration of the predetermined time interval in this non-limiting example is 37 ms.

The circuit 200 is provided with redundant power supplies from a first redundant power supply terminal 296b and a second redundant power supply terminal 296c during normal operation of the circuit 200. The circuit 200 may also receive electrical power from the analogue timing signal via an analogue power supply terminal 296a.

When the driver 290 receives either the digital-counter-output-signal or the analogue-trigger-signal, the driver 290 supplies a voltage to a control-switch 292 to open the control switch 292. This action enables remaining charge current to drain rapidly from the timing-capacitor 249 to an earth terminal 294. The consequent change in voltage provides the second-error-signal 222 at FS1B 220.

Figure 3:
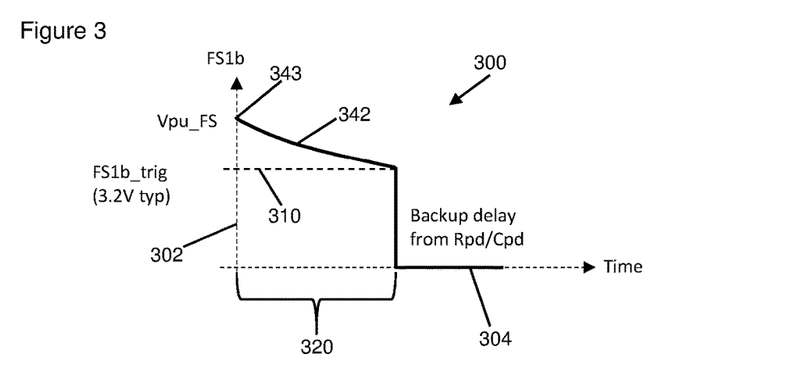
FIG. 3 shows an example embodiment of an analogue timing signal.

FIG. 3 shows a chart 300 of the time dependent behaviour of the analogue-timing-signal 342 provided by the external analogue timing circuit shown in FIG. 2. Voltage is shown on the vertical axis 302, while time is shown on the horizontal axis 304. The analogue-timing-signal 342 declines from an initial value 343 until it reaches a threshold value (FS1b_trig) 310, after a predetermined time interval 320. When the predetermined time interval 320 has elapsed the control switch shown in FIG. 2 is opened, as described above, and the voltage of the analogue-timing-signal 342 is rapidly reduced to zero by the short circuit to earth. Using the discharge of a timing capacitor in this way provides for a very simple and reliable way of providing an analogue-timing-signal 342 to provide the predetermined time interval 320.

Figure 4:
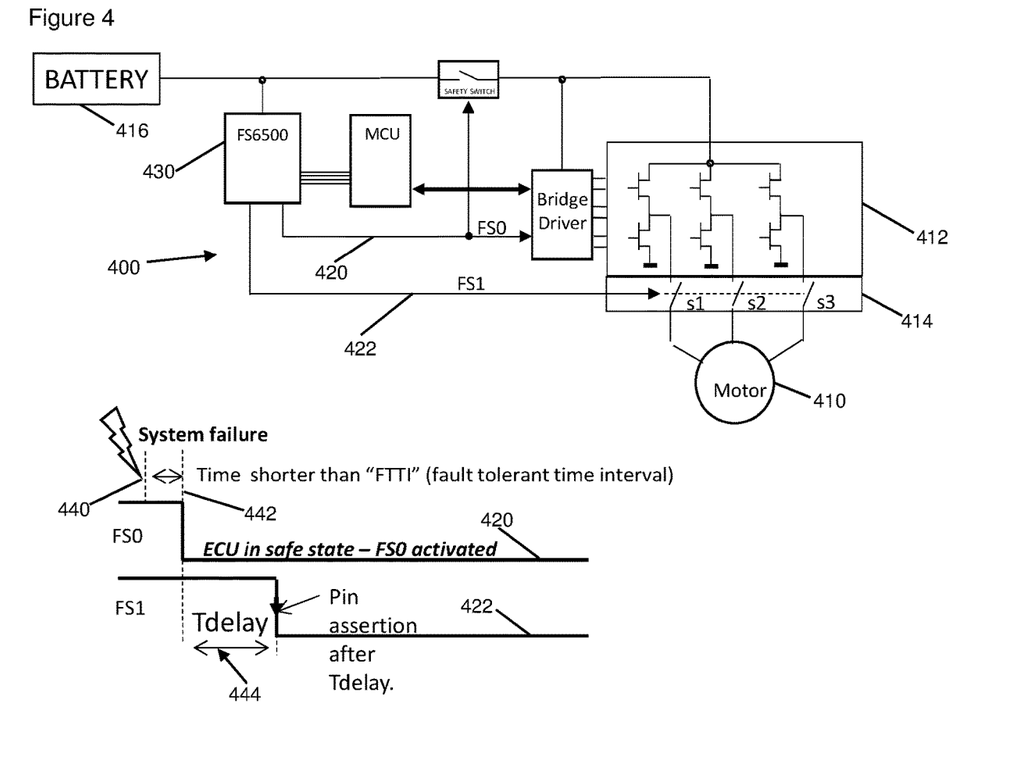
FIG. 4 shows an example embodiment of an integrated circuit similar to that of FIG. 1 contained within a motor system, together with the signals that the integrated circuit is configured to provide.

FIG. 4 shows an electrical system 400 comprising a motor 410 that is connected to a first set of switches 412 and a second set of switches 414. In other examples the motor 410 may be replaced by any other form of electrical load. The switches 412, 414 may be closed to connect the motor 410 to a power supply 416 for normal operation. FIG. 4 also shows a schematic illustration of a first-error-signal 420 and a second-error-signal 422 which may be provided by a circuit 430 that forms part of the electrical system 400. The circuit 430 may include the functionality of the integrated circuits of FIGS. 1 and 2, as described above.

A failure event occurs at a first point in time 440. The circuit 430 is configured to detect the failure event and respond to it by providing the first-error-signal 420 at a second point in time 442 which occurs less than a fault tolerant time interval after the first point in time 440. The circuit is also configured to provide the second-error-signal 422 a predetermined time interval 444 after the second point in time 442.

The first set of switches 412 is configured to be operated based on the first-failure-signal 420. The second set of switches 414 is configured to be operated based on the second-failure-signal 422. In this way, the motor 410 may be sequentially disconnected from the power supply 416, with the sequence occurring with the predetermined time interval elapsing between the operation of the first set of switches 412 and the second set of switches 414. The sequential disconnection provided in this way may be considered as an example of cascaded deactivation. Cascaded deactivation may provide advantages in safely shutting down electrical systems when a failure event has occurred.

At a first-error-signal reset time, the first-error-signal 420 output from the circuit 430 may be reset to a first-safe-level signal. Similarly, at a second-error-signal reset time the second-error-signal 422 output from the circuit 430 may be reset to a second-safe-level signal. The second-error-signal reset time may occur before the first-error-signal reset time, but it will be appreciated that this order may also be reversed, or the signals may be reset at the same time. This resetting may occur after the electrical system 400 has been powered down and then powered up again, if the electrical system 400 is then functioning correctly.

In some examples the electrical system 400 may comprise an automotive system such as a car or other vehicle, or a sub-component thereof. In other examples the electrical system 400 may comprise a lift or elevator, or some other piece of industrial equipment.

In some examples the circuits described above in relation to FIGS. 1, 2 and 4 may be provided as a System Based Chip (SBC). Such SBCs may include safety features, such as the capability to provide a first-error-signal and a second-error-signal separated by a desired predetermined time interval. Such SBCs may be used to provide system target Automotive Safety Integrity Levels (ASILs). In some examples such SBCs may comprise architecture suitable for implementing ISO26262 ASIL D level capabilities.

An SBC may include one or more dedicated Fail Safe outputs, such as the first-error-signal and/or the second-error-signal. These outputs may be asserted, or provided, following a failure event occurring in a system associated with the SBC. Such systems may comprise a microcontroller, and/or other components that may be part of an Electronic Control Unit (ECU). Alternatively the failure event may occur within the SBC itself.

First generation SBCs have a single and unique Fail Safe output (FS), which may be called 'FS0', which may be an example of a first-error-signal. Second generation SBC's may have two fail safe outputs. The second Fail Safe output, which may be called FS1 and may be an example of a second-error-signal, may be activated sequentially after a dedicated delay (corresponding to the predetermined time interval) after the first fail safe output has been provided.

In some applications the delay between FS0 and FS1 is critical and necessary for the safety performance of the application, and should be guaranteed in all possible application operating conditions, including failure events.

The delay between FS1 and FS0 is generated by the SBC internal circuitry, which may comprise an oscillator, frequency dividers, and an output driver. These circuits are powered via one or more power supply lines to ensure some level of redundancy. Such circuitry may also be verified by analogue and logic BIST (built in self test) mechanisms.

However in some system failure events, some or part of the circuitry may cease operation. By using circuitry according to the present disclosure it may, however, be possible to improve the likelihood to guarantee the duration of the delay between FS0 and FS1.

Circuitry according to the present disclosure may provide additional mechanisms to guarantee the proper assertion of FS1 and the delay between FS0 and FS1, in all possible system or SBC failure events and/or faults. Such faults may include, as non-limiting examples, loss of system power supply, local power supply loss, oscillator operating incorrectly or not operating, and any form of logic failure.

Use of a secondary timing generator and a back up power supply (which may be called an autarky supply) and a parallel control line for the second-error-signal output may be advantageous. In some examples these components may be combined into a single unit of circuitry, such as an integrated circuit.

Within an SBC of the present disclosure there may be provided dedicated circuitry configured to provide a back up and an autarky supply. Within such an SBC there may be provided an independent timing generator. There may be provided mechanisms to independently verify the autarky supply and the timing generator via a Built In Self Test (BIST) realized at system level.

It will be appreciated that in complex electrical systems providing a single failure-signal may not be sufficient to enable effective management of a failure event because a plurality of different failure event management actions may be required. Embodiments of the present disclosure may advantageously enable failure event management in such complex electrical systems.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An integrated circuit comprising:
   an input terminal configured to receive a failure-event-signal representative of a failure event;
   a first output terminal configured to provide a first-failure-signal; and
   a second output terminal configured to provide a second-failure-signal; and
   a processing block configured to:
      set the first-failure-signal based on the failure-event-signal; and
      set the second-failure-signal, at a predetermined time interval after the first-failure-signal is set,
   wherein the processing block further comprises a switch configured selectively, based on a received digital-error-signal to either:
      set the second-failure-signal based on a digital-counter-output-signal; or
      set the second-failure-signal based on an analogue-trigger-signal.

2. The integrated circuit of claim 1, wherein the processing block comprises a digital-counter configured to receive the first-failure-signal and generate a digital-counter-output-signal that is configured to set the second-failure-signal at the predetermined time interval after the first-failure-signal is set.

3. The integrated circuit of claim 1, wherein the integrated circuit further comprises:
   an analogue-timing-input-terminal configured to receive an analogue-timing-signal; and the processing block comprises:
   a comparator configured to set the second-failure-signal at the predetermined time interval after the first-failure-signal is set based on the analogue-timing-signal.

4. The integrated circuit of claim 3, wherein the comparator is configured to set an analogue-trigger-signal in response to the analogue-timing-signal satisfying a threshold value.

5. The integrated circuit of claim 3, wherein the processing block further comprises an analogue-timing-control-block configured to:
receive an analogue-error-signal; and
initiate a change in the analogue-timing-signal based on the analogue-error-signal.

6. The integrated circuit of claim 5, wherein the processing block further comprises an analogue-self-test-block configured to:
provide an error-signal to the analogue-timing-control-block based on a received analogue-self-test-signal, wherein the error-signal is configured to initiate a change in the analogue-timing-signal; and
process the analogue-timing-signal in order to generate an analogue-self-test-output-signal based on whether or not the analogue-timing-signal satisfies a predetermined criterion.

7. The integrated circuit of claim 6, wherein the error-signal is indicative of an error associated with the digital-counter and / or an error associated with a power supply for the integrated circuit.

8. The integrated circuit of claim 7, wherein the processing block further comprises an error-detection-block configured to provide the error-signal based on a status of the digital-counter and /or a power supply for the integrated circuit.

9. The integrated circuit of claim 1, wherein the processing block comprises a driver configured to set the second-failure-signal based on either a digital-counter-output-signal or an analogue trigger-signal, the driver comprising a driver-power-terminal configured to receive power from a plurality of power supplies.

10. The integrated circuit of claim 9, wherein the plurality of power supplies comprise one or more power supplies that are internal to the integrated circuit.

11. The integrated circuit of claim 9, wherein the plurality of power supplies comprise one or more power-supply-terminals configured to receive power from one or more power supplies that are external to the integrated circuit.

12. The integrated circuit of claim 11, wherein a power-supply-terminal comprises the analogue-timing-input-terminal.

13. A system comprising:
the integrated circuit of claim 1, comprising an analogue-timing-input-terminal configured to receive an analogue-timing-signal; and
an analogue-timing-circuit configured to provide the analogue-timing-signal.

14. The system of claim 13, wherein the system comprises an electrical load that is connected to a first set of switches and a second set of switches, and wherein the first set of switches is configured to be operated based on the first-failure-signal, and the second set of switches is configured to be operated based on the second-failure-signal.

15. An automotive system comprising the integrated circuit of claim 1.

* * * * *